United States Patent [19]

Imanishi

[11] Patent Number: 5,177,414
[45] Date of Patent: Jan. 5, 1993

[54] VERTICAL DEFLECTION CIRCUIT

[75] Inventor: Kazuo Imanishi, Yokohama, Japan

[73] Assignee: Kabushiki Kaisha Toshiba, Kanagawa, Japan

[21] Appl. No.: 688,512

[22] PCT Filed: Oct. 4, 1990

[86] PCT No.: PCT/JP90/01285
    § 371 Date: Jun. 3, 1991
    § 102(e) Date: Jun. 3, 1991

[87] PCT Pub. No.: WO91/05433
    PCT Pub. Date: Apr. 18, 1991

[30] Foreign Application Priority Data
    Oct. 4, 1989 [JP] Japan .................. 1-259661

[51] Int. Cl.⁵ .................. H01J 29/70; H01J 29/76
[52] U.S. Cl. ..................... 315/403; 315/389
[58] Field of Search .............. 315/389, 388, 403

[56] References Cited

U.S. PATENT DOCUMENTS 3,991,345  11/1976  Jaspers ................. 315/388
4,161,676   7/1979  Alisic et al. ........... 315/388
4,719,393   1/1988  McCanney ............... 315/397

FOREIGN PATENT DOCUMENTS 2131107  12/1971  Fed. Rep. of Germany.

Primary Examiner—Theodore M. Blum
Attorney, Agent, or Firm—Finnegan, Henderson, Farabow, Garrett and Dunner

[57] ABSTRACT

A saw-tooth wave signal is supplied to the non-inverting input terminal of a first power amplifier constituting a first negative feedback amplifier. The output terminal of the first power amplifier is connected to one terminal of a deflection coil. A signal output from the other terminal of the deflection coil is supplied to the inverting input terminal of the first power amplifier. The other terminal of the deflection coil is connected, through a resistor, to the output terminal of a second power amplifier constituting a second negative feedback amplifier. The output terminal of the second power amplifier is connected to the inverting input terminal of the second power amplifier. The DC voltage appearing at the output terminal of the second power amplifier in the non-signal state is set to be equal to that of the first negative feedback amplifier. A circuit means is provided between the non-inverting input terminal of the second power amplifier and the first non-inverting input terminal for operating the second power amplifier in the phase opposite to that of the first power amplifier.

6 Claims, 2 Drawing Sheets

VERTICAL DEFLECTION CIRCUIT

TECHNICAL FIELD

The present invention relates to a low-frequency power circuit and, more particularly, to a vertical deflection circuit of a television receiver.

BACKGROUND ART

FIG. 4 shows a conventional SEPP (Single Ended Push-Pull) type vertical deflection circuit comprising a single power source.

An input terminal 1 for receiving a saw-tooth wave signal is connected to the non-inverting input terminal of a power amplifier 2. The output terminal of the power amplifier 2 is connected to an output terminal 3 and at the same time is grounded through resistors R1 and R2. The node of the resistors R1 and R2 is connected to the inverting input terminal of the power amplifier 2. A series circuit of a vertical deflection coil L, capacitors C1 and C2, and a resistor R3 is connected between the output terminal 3 and the node of the resistors R1 and R2. The node of the capacitors C1 and C2 is grounded through a resistor R4.

The resistors R1 and R2 are negative feedback resistors for determining the DC operating point of the output signal of the power amplifier 2. The capacitors C1 and C2 are DC-blocking capacitors. Especially, in an SEPP type vertical deflection circuit comprising a single power source, the capacitor C1 operates as a power source during a negative half cycle. Therefore, an electrolytic capacitor having a large capacitance of about 1,000 μF is used as the capacitor C1.

In the above arrangement, assuming that the DC voltage is Vref with no signal being input to the input terminal 1, the potential Vo at the output terminal 3 is:

$$Vo = Vref(R1 + R2)/R2$$

On the other hand, during AC operation, i.e., when a saw-tooth wave signal is input to the input terminal 1, the capacitors C1 and C2 are conductive. Thus, an AC power amplification factor Gv is approximately:

$$(R3 + R2)/R2$$

$$(X_{c1}, X_{c2} < < R1 \sim R3, R3 < < R1)$$

where:
$X_{c1}$ = reactance of capacitor C1
$X_{c2}$ = reactance of capacitor C2

During an AC operation, a feedback occurs from the node A of the capacitors C1 and C2, and accordingly, a negative feedback occurs such that a signal generated in the resistor R4 becomes Gv times an input signal. As a result, assuming that an input signal is Vin, a current $$(Vin \cdot Gv)/R4$$

having a good linearity flows across the vertical deflection coil L.

However, since the conventional vertical deflection circuit is an SEPP circuit having a single power source, the large-capacitance capacitor C1 is required for DC blocking. Furthermore, since an AC saw-tooth wave signal is supplied to the vertical deflection coil L, the resistors R1 to R3, the capacitor C2, and the like are also required to determine the AC and DC operating points.

Normally, the power amplifier 2 is packaged in an integrated circuit to increase the reliability and to lower the price. However, the capacitors C1 and C2, the resistors R1 to R4, and the like are components that are externally connected to the integrated circuit. When the number of components externally connected to an integrated circuit is large, the reliability is degraded and the cost increases.

DISCLOSURE OF INVENTION

It is an object of the present invention to provide a vertical deflection circuit in which the problems associated with a conventional vertical deflection circuit are solved and the number of components externally connected to an integrated circuit is decreased to increase the reliability and to suppress an increase in cost.

In order to solve the problems described above, the present invention provides a first negative feedback amplifier, having an input terminal to which a saw-tooth wave is supplied, and an output terminal connected to one terminal of a deflection coil, a second negative feedback amplifier, having an output terminal to which the other terminal of the deflection coil is connected through a resistor, the output terminal outputting a direct-current voltage which is set to be equal to that of the first negative feedback amplifier in a non-signal stage, and circuit means, provided between an input terminal of the second negative feedback amplifier and the input terminal of the first negative feedback amplifier, for operating the second negative feedback amplifier in a phase opposite to that of the first negative feedback amplifier.

More specifically, according to the present invention, the output terminals of the first and second negative feedback amplifiers are connected to each other through a series circuit of a deflection coil and a resistor. The voltages at the output terminals of the first and second negative feedback amplifiers in the non-signal state are set equal to each other. The second negative feedback amplifier is operated in a phase opposite to that of the first negative feedback amplifier. Hence, a capacitor for blocking a DC output can be eliminated. DC and AC feedback loops need not be provided. As a result, the number of components externally connected to the integrated circuit can be reduced, thereby suppressing an increase in cost.

BEST MODE OF CARRYING OUT THE INVENTION

Preferred embodiments of the present invention will be described with reference to the accompanying drawings.

Figure 1:
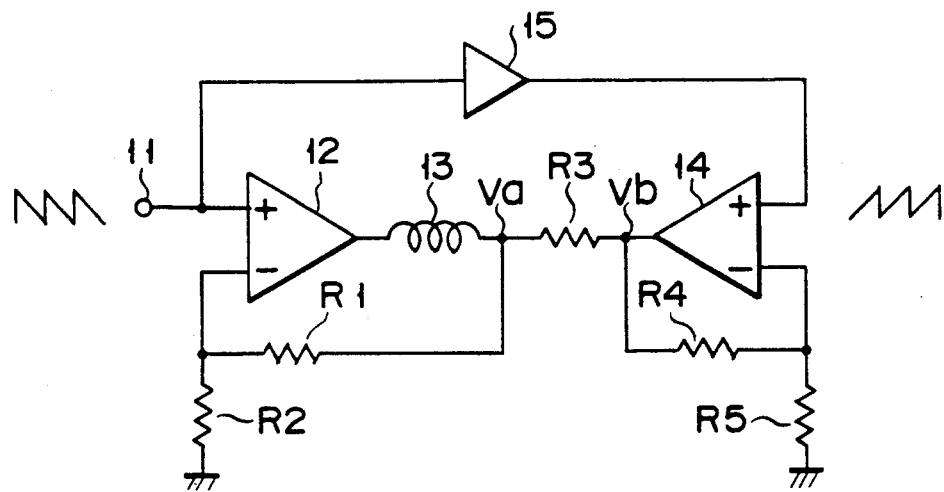
FIG. 1 is a circuit diagram of the first embodiment of the present invention.

Referring to FIG. 1, an input terminal 11 is connected to the non-inverting input terminal of a power amplifier 12 constituting a first negative feedback amplifier. The power amplifier 12 is, e.g., an SEPP circuit having a single power source which is constituted by an integrated circuit. The output terminal of the power amplifier 12 is connected to one terminal of a vertical deflection coil 13. The other terminal of the deflection coil 13 is grounded through a series circuit of resistors R1 and R2. The node of the resistors R1 and R2 is connected to the inverting input terminal of the power amplifier 12.

The other terminal of the vertical deflection coil 13 is also connected, through a resistor R3 for determining a saw-tooth wave current, to the output terminal of a power amplifier 14 constituting a second negative feedback amplifier. The power amplifier 14 is, e.g., an SEPP circuit having a single power source and constituted by an integrated circuit. The output terminal of the power amplifier 14 is grounded through a series circuit of resistors R4 and R5. The node of the resistors R4 and R5 is connected to the inverting input terminal of the power amplifier 14. The non-inverting input terminal of the power amplifier 12 is connected to the non-inverting input terminal of the power amplifier 14 through an inverting amplifier 15.

Figure 2:
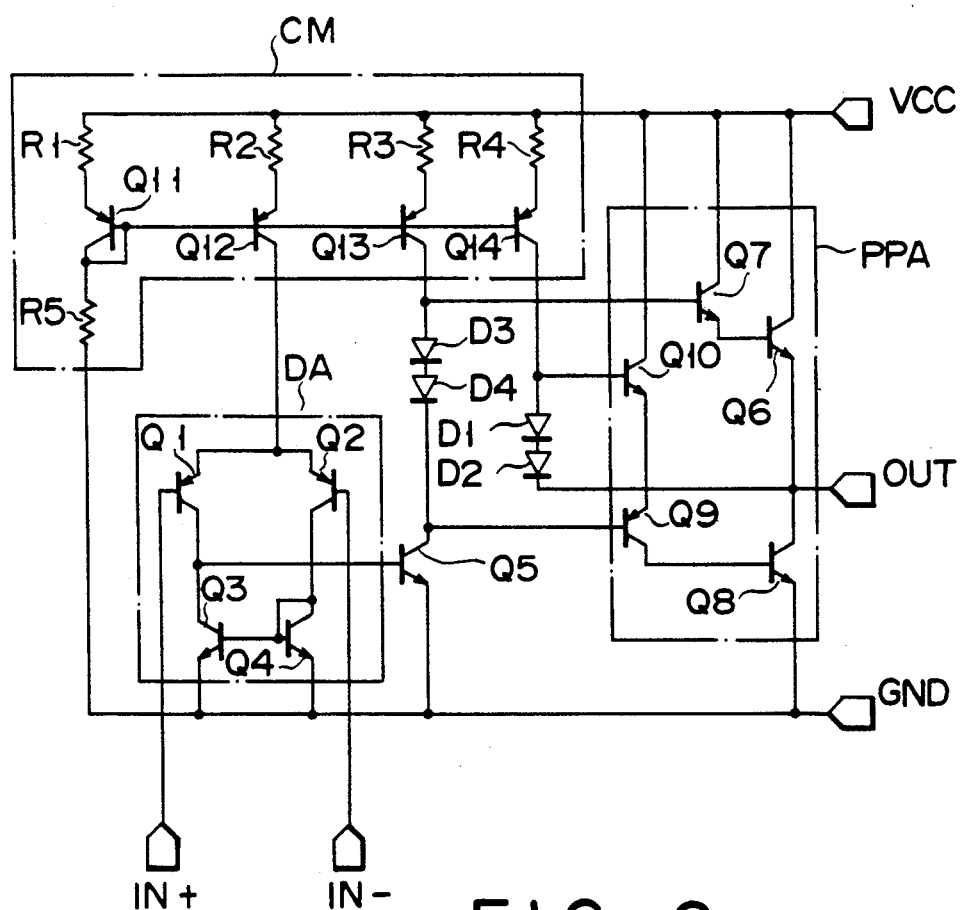
FIG. 2 is a circuit diagram of an example of a power amplifier shown in FIG. 1.

FIG. 2 shows an example of the power amplifier 12 or 14.

An input differential amplifier DA is constituted by transistors Q1 to Q4. Non-inverting and inverting input terminals IN+ and IN− are connected to the bases of the transistors Q1 and Q2, respectively. A transistor Q5 constitutes a voltage amplification stage. The base of the transistor Q5 is connected to the node of the collector of the transistor Q1 and the collector of the transistor Q3. Transistors Q6 to Q10 constitute a class "B" push-pull amplifier PPA. Of the transistors Q6 to Q10, the transistors Q6 and Q8 are power transistors whose current paths are series-connected between a power source Vcc and a ground GND. The node of the emitter of the transistor Q6 and the collector of the transistor Q8 is connected to an output terminal OUT. The transistors Q7, Q9, and Q10 are drive transistors for driving the transistors Q6 and Q8. Diodes D1 and D2, connected between the base of the transistor Q10 and the output terminal OUT, and diodes D3 and D4, connected between the base of the transistor Q7 and the base of the transistor Q9, set the idling current of transistor Q6 and Q8 in a non-signal state. A current-mirror circuit CM is constituted by transistors Q11 to Q14 and resistors R1 to R5. The transistor Q11 and the resistors R1 and R5 set the reference current. The transistor Q12 and the resistor R2 constitute the bias current source circuit of the input differential amplifier DA. Transistors Q13 and Q14, and the resistors R3 and R4 constitute the bias current source circuit of the class "B" push-pull amplifier PPA.

In the above arrangement, the power amplifiers 12 and 14 operate in the opposite phases to each other through an inverting amplifier 15. Assuming that the voltage gain of the inverting amplifier 15 is one and the potential at the input terminals of the power amplifiers 12 and 14 is Vref, potentials Va and Vb at the two terminals of the resistor R3 are:

$Va = (R1 + R2)Vref/R2$ $Vb = (R4 + R5)Vref/R5$

When the ratio of the resistor R1 to the resistor R2 and that of the resistor R4 to the resistor R5 are set equal to each other, the following relation is obtained:

$Va = Vb$ and no current flows across the output terminals of the power amplifiers 12 and 14 in the non-signal state.

On the other hand, the gain with respect to an AC signal is the same as that for the DC signal. A voltage gain Gv is:

$Gv = (R1 + R2)/R2$ $= (R4 + R5)/R5$

However, since the inverting amplifier 15 is present between the input terminals of the power amplifiers 12 and 14, the phases of the amplifiers 12 and 14 are opposite to each other. A negative feedback is applied on the power amplifier 12 from the node of the vertical deflection coil 13 and the resistor R3 through the vertical reflection coil 13. Therefore, the gain described above is a gain between the input terminal 11 and this node.

When a saw-tooth wave input signal Vin is supplied to the input terminal 11, voltages $V_{12}$ and $V_{14}$ at the output terminals of the power amplifiers 12 and 14 are:

$V_{12} = Gv \cdot Vin$ $V_{14} = -Gv \cdot Vin = -V_{12}$ and a potential difference between the two terminals of the resistor R3 is:

$V_{12} - V_{14} = 2V_{12}$

As a result, saw-tooth wave current of $2V_{12}/R3 = 2Vin \cdot Gv/R3$ flows through the vertical deflection coil 13. Hence, a current twice that of the conventional case can be obtained.

In the above embodiment, the output terminal of the power amplifier 12 is connected, through the vertical deflection coil 13 and the current-determining resistor R3, to the output terminal of the power amplifier 14 that operates in the opposite phase to that of the power amplifier 12. As a result, no DC current flows across the output terminals of the power amplifiers 12 and 14, and thus the vertical deflection coil 13 and the current-determining resistors R1 and R2 can be directly coupled to each other without using a large-capacitance DC-blocking capacitor.

In addition, when the ratio of the resistor R1 to the resistor R2 is selected so as to obtain an optimum operating point regarding the input DC potential, the output DC, and the output AC, in other words, to obtain a maximum amplitude, the need to provide both the AC and DC feedback loops is eliminated, unlike in the conventional case. Hence, the number of components externally connected to the power amplifiers 12 and 14 each constituted by an integrated circuit can be reduced.

Figure 3:
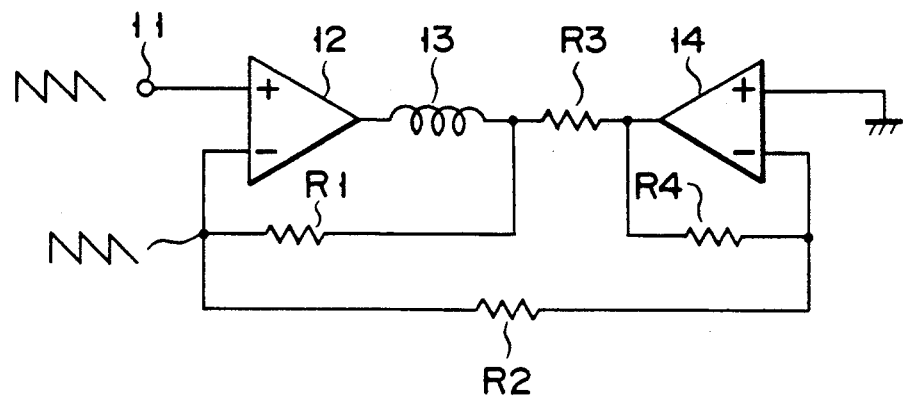
FIG. 3 is a circuit diagram of the second embodiment of the present invention.
Figure 4:
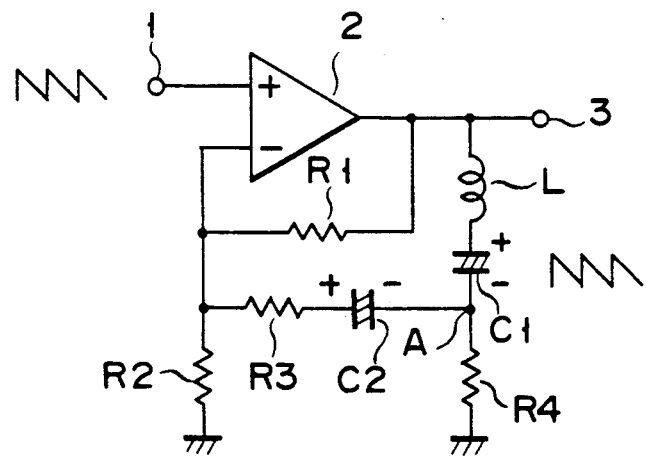
FIG. 4 is a circuit diagram of a conventional vertical deflection circuit.

FIG. 3 shows the second embodiment of the present invention. The same portions as in FIG. 1 are denoted by the same reference numerals. Only portions different from those in FIG. 1 will be described.

In the first embodiment, the phase of the power amplifier 14 is set to be opposite to that of the power amplifier 12 by using the inverting amplifier 15. In the second embodiment, the phase of a power amplifier 14 is set to be opposite to that of a power amplifier 12 without using an inverting amplifier 15.

More specifically, the non-inverting input terminal of the power amplifier 14 is grounded, the resistor R5 of the power amplifier 14 is removed, and the inverting input terminals of the power amplifiers 12 and 14 are connected through the resistor R2 of the power amplifier 12.

In the above arrangement, the inverting input terminal of the power amplifier 14 is grounded. Thus, the power amplifier 12 becomes a non-inverting amplifier whose gain is determined by the ratio of a resistor R1 to a resistor R2. The power amplifier 14 becomes an inverting amplifier whose gain is determined by the ratio of a resistor R4 to the resistor R2.

With this arrangement, a DC-blocking capacitor can be eliminated, as in the first embodiment, and the number of the components can be reduced.

It is obvious that various changes and modifications can be made without departing from the spirit and scope of the invention.

INDUSTRIAL APPLICABILITY

As has been described above in detail, according to the present invention, a capacitor for blocking a DC output can be eliminated, and neither DC nor AC feedback loops are provided. As a result, the number of components externally connected to an integrated circuit can be reduced, suppressing an increase in cost. Hence, the present invention is effective in the field of television techniques and has a high applicability.

I claim:

1. A vertical deflection circuit comprising:
   a first negative feedback amplifier having an input terminal, said input terminal being supplied with a saw-tooth wave, and an output terminal connected to one terminal of a deflection coil;
   a second negative feedback amplifier having an output terminal connected to another terminal of said deflection coil through a resistor, said output terminal outputting a direct-current voltage that is set to be equal to that of said first negative feedback amplifier in a non-signal stage; and
   circuit means, provided between an input terminal of said second negative feedback amplifier and said input terminal of said first negative feedback amplifier, for operating said second negative feedback amplifier in a phase opposite to that of said first negative feedback amplifier.

2. A vertical deflection circuit according to claim 1, wherein said circuit means comprises an inverting amplifier.

3. A vertical deflection circuit according to claim 1, wherein said first and second negative feedback amplifiers each comprises a single ended push-pull circuit.

4. A vertical deflection circuit comprising:
   a first negative feedback amplifier having a first inverting input terminal, a first non-inverting input terminal, and a first output terminal, said first non-inverting input terminal being supplied with a sawtooth wave, said first output terminal being connected to one terminal of a deflection coil, said deflection coil having another terminal negatively fed back to said first inverting input terminal;
   a second negative feedback amplifier having a second inverting input terminal, a second non-inverting input terminal, and a second output terminal connected to said another terminal of said deflection coil through a resistor, said second output terminal being connected to said second inverting input terminal, and said second output terminal outputting a direct-current voltage that is set to be substantially equal to that of said first negative feedback amplifier in a non-signal state; and
   an inverting amplifier, connected between said second non-inverting input terminal of said second negative feedback amplifier and said first non-inverting input terminal of said first negative feedback amplifier, for operating said second negative feedback amplifier in a phase opposite to that of said first negative feedback amplifier.

5. A vertical deflection circuit comprising:
   a first negative feedback amplifier having a first inverting input terminal, a first non-inverting input terminal, and a first output terminal, said first non-inverting input terminal being supplied with a sawtooth wave, said first output terminal being connected to one terminal of a deflection coil, said deflection coil having another terminal negatively fed back to said first inverting input terminal;
   a second negative feedback amplifier, having a second inverting input terminal, a second non-inverting input terminal that is grounded, and a second output terminal connected to said another terminal of said deflection coil through a resistor, said second output terminal being connected to said second inverting input terminal, and said second output terminal outputting a direct-current voltage that is set to be substantially equal to that of said first negative feedback amplifier in a non-signal state; and
   a circuit means, connected between said second inverting input terminal of said second negative feedback amplifier and said first inverting input terminal of said first negative feedback amplifier, for operating said second negative feedback amplifier in a phase opposite to that of said first negative feedback amplifier.

6. A vertical deflection circuit according to claim 5, wherein said circuit means comprises a resistor.

* * * * *